United States Patent [19]
Yamada

[11] Patent Number: 5,765,212
[45] Date of Patent: *Jun. 9, 1998

[54] MEMORY CONTROL CIRCUIT THAT SELECTIVELY PERFORMS ADDRESS TRANSLATION BASED ON THE VALUE OF A ROAD START ADDRESS

[75] Inventor: Susumu Yamada, Moriguchi, Japan

[73] Assignee: Sanyo Electric Co., Ltd., Osaka, Japan

[*] Notice: The term of this patent shall not extend beyond the expiration date of Pat. No. 5,594,888.

[21] Appl. No.: 509,500

[22] Filed: Jul. 28, 1995

[30] Foreign Application Priority Data

Jul. 29, 1994 [JP] Japan .................................. 6-178165

[51] Int. Cl.$^6$ .............................. G11C 8/00; G06F 13/00
[52] U.S. Cl. .................... 711/213; 711/5; 711/157; 711/168; 711/218
[58] Field of Search ........................ 711/213, 204, 711/218, 217, 168, 169, 5, 157; 365/230.03, 230.04

[56] References Cited

U.S. PATENT DOCUMENTS

| | | | |
|---|---|---|---|
| 4,086,629 | 4/1978 | Desyllas et al. | 395/421.03 |
| 4,319,324 | 3/1982 | Johnson et al. | 395/405 |
| 4,378,591 | 3/1983 | Lemay | 395/403 |
| 4,424,561 | 1/1984 | Stanley et al. | 395/403 |
| 5,550,996 | 8/1996 | Shiba et al. | 395/421.03 |
| 5,594,888 | 1/1997 | Yamada | 395/495 |

*Primary Examiner*—Eddie P. Chan
*Assistant Examiner*—Hong C. Kim
*Attorney, Agent, or Firm*—Loeb & Loeb LLP

[57] ABSTRACT

A memory control circuit improves the read speed of a program memory stored in a ROM. The memory control circuit includes a memory divided into four blocks, an address translation circuit for providing address 4N+1 to blocks 0 and 1 only when the required read address is 4N+2 or 4N+3, a set of latch circuits for latching data read from each of the blocks, and a selector circuit for selecting necessary data from among the latched data and outputting it to a data bus. Accordingly, three or more blocks of memory are made readable in every latched operation.

18 Claims, 9 Drawing Sheets

MEMORY CONTROL CIRCUIT THAT SELECTIVELY PERFORMS ADDRESS TRANSLATION BASED ON THE VALUE OF A ROAD START ADDRESS

BACKGROUND OF THE INVENTION

1. Field of the Invention

This invention relates to a memory control circuit, and more particular to a circuit for controlling read and transfer of instruction data from a memory in response to a request from an instruction processing unit.

2. Description of Related Art

Currently, integrated circuits incorporating a memory, such as a ROM or RAM, and an instruction processing unit on a semiconductor chip (i.e. a so-called single-chip microcomputer), are widely used. This is mainly because advanced semiconductor technology has created highly efficient integrated circuit devices, which has further generated new demands. Namely, as the personal use of high-performance apparatus has spread, the demand for a miniaturized, high-speed operative and inexpensive control device has grown. Recent examples of such integrated circuit devices include a controller of game machines, MPEG controllers, or a motor controller for video cameras, all of which are demanding further improved high-speed operation. Such integrated circuit devices are also in use for portable apparatus (e.g. a portable telephone set) having a low operation voltage for the purpose of improving battery actuation time. Therefore, an integrated circuit capable of working at higher speed, even at low voltage is now in demand.

Such an integrated circuit device generally includes an instruction processing unit for carrying out instruction processing, a ROM for storing instruction information, and a RAM for storing data. A way of creating a high-speed operative integrated circuit device is to improve execution time of the instruction processing unit. In other words, it is important to improve clock frequency and an instruction execution algorithm, and to shorten the read time for the memory.

Conventionally, it has been tried to minimize gate capacitance by subdividing processes and to choose the best layout in order to improve clock frequency, and these efforts, as well as pipelining of processes, have improved operation speed. However, with respect to memory read, total data read time has not been sufficiently improved.

In an integrated circuit device such as a single-chip microcomputer, the read operation for a memory is carried out in byte units. As the speed of the instruction processing unit has been greatly improved, the burden of the memory read time has become an obstacle requiring further improvement.

Reduction of memory read time can be realized by increasing the size of the transistors constituting the memory. However, this naturally causes the chip size to be increased. Since a single-chip microcomputer is generally mounted on an apparatus for personal use, low cost and reduced size are the fundamental conditions, and an increase in the chip size should be avoided in a final product. For the same reason, it should be avoided to incorporate a cache memory on a chip, although it is common in a high-speed CPU used in a more expensive high end personal computer. There is also a technique of dividing a memory into banks and interleaving them one after another. However, this method makes the control circuit large, and makes the overhead for address branching inevitable. In a certain type of single-chip microcomputer, an alignment technique is used, by which instructions are arranged at predetermined byte intervals in the memory to improve the operation speed of instruction fetch, decoding, and execution. However, in this method, an unnecessary space is generated between instructions, resulting in reduced utilization efficiency of the memory.

The present invention was conceived to overcome the abovementioned problems, and aims to provide a control circuit which realizes improved memory read speed while maintaining a superior price-to-performance ratio, and especially to provide a memory control circuit which gives full effect when incorporated into an integrated circuit device such as a single-chip microcomputer.

SUMMARY OF THE INVENTION

In order to achieve this object, a memory control circuit in accordance with the invention controls read and transfer of data from a memory in response to a read request by an instruction processing unit, which comprises (1) a memory divided into $2^M$ blocks i ($i=0, 1, \ldots, 2^M-1$), each block i storing data corresponding to address $2^M N+i$, where M is a natural number equal to or greater than 2, and N is a non-negative integer, (2) an address translation circuit for performing address translation on a read address issued by the instruction processing unit in accordance with a predetermined translation rule, the translation rule being, when the read start address requested by the instruction processing unit is $2^M N+j$ ($j=0, 1, \ldots, 2^{M-1}-1$), to supply address $2^M N$ to all blocks, and when the read start address requested by the instruction processing unit is $2^M N+j$ ($j=2^{M-1}, 2^{M-1}+1, \ldots, 2^M-1$), to supply address $2^M N$ to the latter half of blocks j ($j=2^{M-1}, 2^{M-1}+1, \ldots, 2^M-1$) and to supply address $2^M(N+1)$ to the former half of blocks j ($j=0, 1, \ldots, 2^{M-1}-1$), (3) a latch circuit provided for each block with one-to-one correspondence and for latching data read from the corresponding block by the instruction processing unit, the latching operation being carried out simultaneously through all of the blocks, thereby allowing $2^M$ blocks of memory including at least $2^{M-1}+1$ successive addresses to be readable by the instruction processing unit for every latching action, and (4) a selector circuit for selecting data, among the latched data, requested by the instruction processing unit and outputting it to a data bus, in response to an address and transfer timing output by the instruction processing unit. The latching by the latch circuits is carried out simultaneously for all of the blocks.

The memory is divided into $2^M$ blocks i ($i=0, 1, \ldots, 2^M-1$), and each block i stores data corresponding to the address ($2^M N+i$). When the instruction processing unit requests data read from the memory, if the read start address requested by the instruction processing unit is an address corresponding to blocks in the former half, that is, an address $2^M N+j$ ($j=0, 1, \ldots, 2^{M-1}-1$), the address translation circuit assigns address $2^M N$ to all blocks, and therefore, each block j outputs data corresponding to the address $2^M N+j$. Data output from each of the blocks is latched simultaneously by the corresponding latch circuit. The selector circuit selects data required by the instruction processing unit among the latched data and outputs it to the data bus in accordance with the address and transfer timing requested by the instruction processing unit.

Since the requested address is $2^M N+j$ ($j=0, 1, \ldots, 2^{M-1}-1$), the instruction processing unit can successively read data from that address $2^M N+j$ (as a leading address)

through to the $2^M N+(2^M-1)$th address among addresses from the latched data. The number of successive addresses becomes a minimum of $2^{M-1}+1$ when the value j is a maximum of $2^M-1$. As a result, the instruction processing unit can read data from the $2^M$ blocks of memory containing at least $2^{M-1}+1$ successive addresses at every latching operation.

On the other hand, if the requested address is $2^M N+j$ ($j=2^{M-1}, 2^{M-1}+1, \ldots, 2^M-1$), the address translation circuit assigns address $2^M N$ to blocks j in the latter half ($j=2^{M-1}, 2^{M-1}+1, \ldots, 2^M-1$), while assigning address $2^M(N+1)$ to blocks j in the former half ($j=0, 1, \ldots, 2^{M-1}-1$). In this case, data output from each of the blocks is as follows.

| | |
|---|---|
| Block 0 | $2^M(N + 1)$ |
| Block 1 | $2^M(N + 1) + 1$ |
| Block $2^{M-1} - 1$ | $2^M(N + 1) + 2^{M-1} - 1$ |
| Block $2^{M-1}$ | $2^M N + 2^{M-1}$ |
| Block $2^{M-1} + 1$ | $2^M N + 2^{M-1} + 1$ |
| Block $2^M - 1$ | $2^M N + 2^M - 1$ |

Since the requested address is $2^M N+j$ ($j=2^{M-1}, 2^{M-1}+1, \ldots, 2^M-1$), the instruction processing unit can successively read data from the addresses $2^M N+j$ through to $2^M(N+1)+(2^M-1)$ from among the latched data. The number of successive addresses becomes a minimum of $2^{M-1}+1$ when the value j is a maximum of $2^M-1$. As a result, the instruction processing unit can read data from the $2^M$ blocks of memory containing at least $2^{M-1}+1$ successive addresses at every latching operation.

According to the invention, an integrated circuit device incorporating the above described memory control circuit is also provided. In the integrated circuit device, the memory control circuit is used by an instruction processing unit for reading of its own memory.

DESCRIPTION OF PREFERRED EMBODIMENTS

<Embodiment 1>

The first embodiment will be described on the premise that a memory control circuit is incorporated in a single-chip microcomputer, together with an instruction processing unit having the following features. With such features, the memory control circuit is optimized, resulting in an greatly improved read speed, while maintaining a small circuit size.

Feature 1

The instruction processing unit performs data read and data transfer with the memory with a maximum processing unit of 3 bytes. This processing unit is called a "cycle". When a byte length of an instruction is 3 or less, the instruction read operation is finished in one cycle. When the instruction byte length exceeds 3, the instruction read is carried out through several cycles. In each cycle, data transfer occurs the same number of times as the instruction bytes contained in the cycle (i.e. data transfer is carried out every one byte of the instruction), because the data bus between the instruction processing unit and the memory has a width of one byte similar to the conventional method. For example, when a two byte instruction is read in a cycle, data transfer is carried out twice (1 byte×2). The instruction processing unit issues a read address every cycle, which becomes the start address of data used in the next cycle.

Feature 2

In order to execute a cycle, the instruction processing unit generates signals RD0–RD2, where RD0 represents a demand for data transfer of the first byte in each cycle. Accordingly, the signal RD0 is generated a memory access time after the address is issued to the ROM prior to starting of the cycle. The timing can be adjustable by a known technique. Similarly, RD1 is a read signal for the second byte, and RD2 is for the third byte. When an instruction of two bytes is issued, only RD0 and RD1 are generated in a cycle, in this order. For a 4 byte instruction, there are several operation examples. For instance, RD0–RD2 are generated in a first cycle and RD0 is generated in the next cycle, or RD0 and RD1 are generated in a first cycle and again RD0 and RD1 are generated in the next cycle. Determination of such a combination depends on the internal condition of the instruction processing unit. However, it does not affect the principle of operation of the memory control circuit of the present invention.

With the above-described assumptions, a ROM is used as a memory for storing instructions which are divided into four blocks, because this is a necessary and sufficient structure with respect to the instruction processing unit with a data transfer cycle of 3 bytes maximum.

Figure 1:
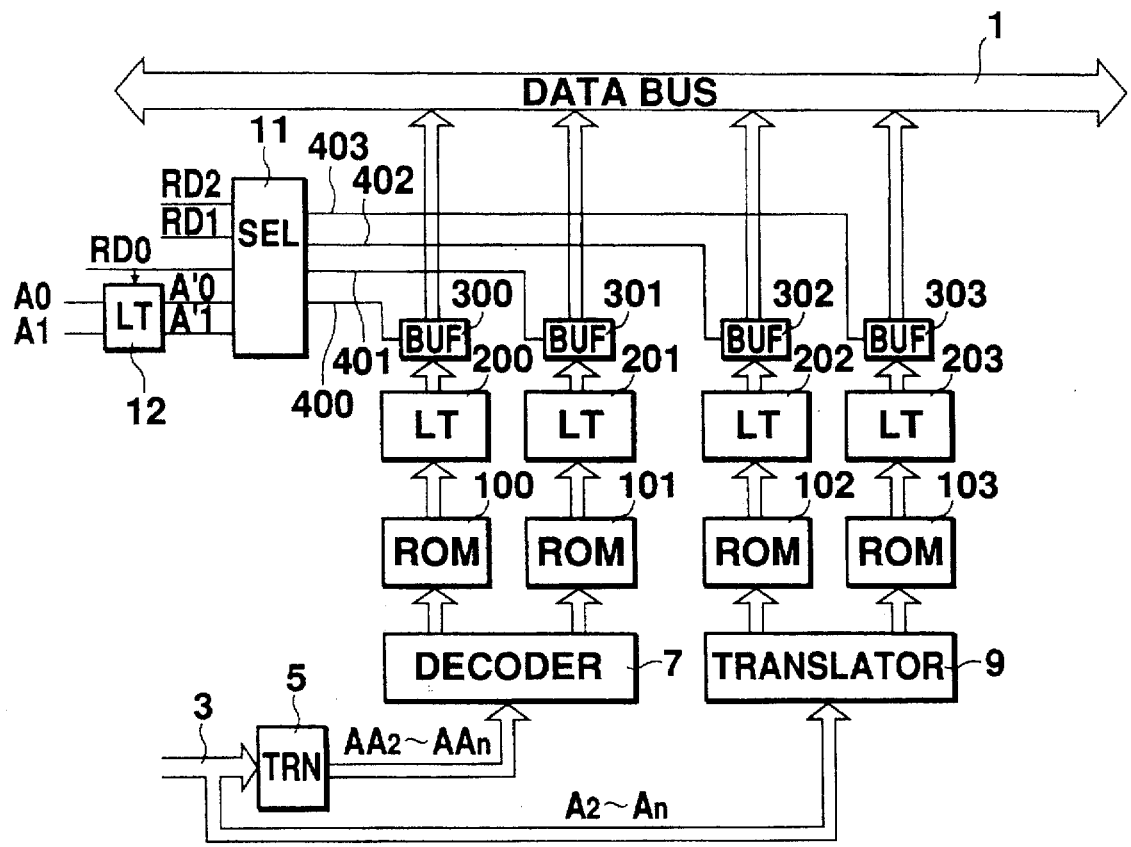
FIG. 1 is a schematic block diagram showing an overall structure of a memory control circuit in accordance with the first embodiment.

FIG. 1 shows an overall structure of a memory control circuit of this embodiment. This memory circuit is incorporated into a single-chip microcomputer, and is connected via a data bus 1 and an address bus 3 to the instruction processing unit (not shown). The address bus 3 consists of $A_0$–$A_n$. The ROM is divided into four blocks of ROM 100–103, each of which stores data corresponding to an address as shown below.

ROM 100 : address 4N
ROM 101 : address 4N+1
ROM 102 : address 4N+2
ROM 103 : address 4N+3, where N is a non-negative integer.

The ROMs 100–103, however, identify their addresses only as "4N", ignoring offset values 0–3 added to the address number 4N. In other words, the ROMs 100–103 do not refer to the lower 2 bits, which define an offset value, of each address. Therefore, when the address to be read is any one of 4N–4N+3, these addresses are assigned to the ROMs 100–103 in general principle as "4N". This rule is changed when considering the function of the address translation circuit 5, the detail of which will be described below.

The address translation circuit 5 applies translation processing to an address which has been supplied through the address bus 3, and supplies the translated address to the ROMs 100 and 101. The rule of the address translation is as follows.

(i) When the supplied address is 4N or 4N+1, no translation is carried out, that is, address 4N is applied to the ROMs 100 and 101.

(ii) When the supplied address is 4N+2 or 4N+3, the address 4(N+1) which corresponds to the next address for the ROMs 100 and 101 is supplied to the ROMs 100 and 101.

Figure 2:
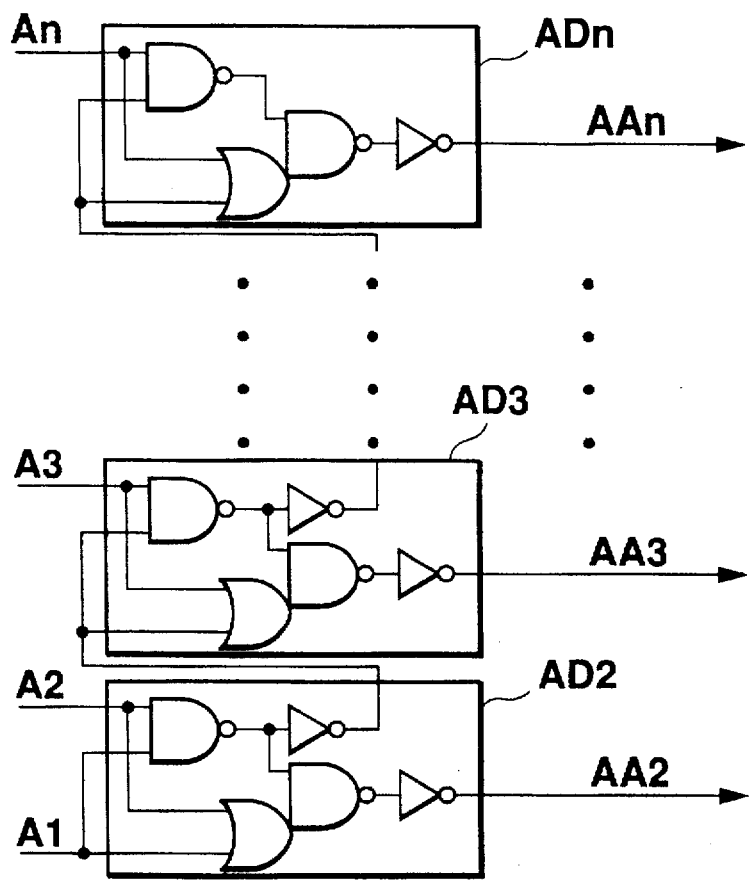
FIG. 2 illustrates an example of an address translation circuit used in the first embodiment.

Assuming that the address is represented by bits $A_0$–$A_n$, this rule can be summarized as "when address bit $A_1$ (i.e. the second lowest order of bit) has a value "1", a value represented by bits $A_2$–$A_n$ for the ROMs 100 and 101 is incremented". This rule is implemented as an address translation circuit 5, which is shown in FIG. 2. In the figure, a value represented by bits $A_2$–$A_n$ is incremented by using adders AD2–ADn consisted of gate elements only when the bit $A_1$ is "1", and the incremented (translated) address represented by bits $AA_2$–$AA_n$ is supplied to the ROMs 100 and 101. On the other hand, address bits $A_2$–$A_n$ are always supplied to the ROMs 102 and 103, without translation.

An address decoder 7 is arranged in front of the ROMs 100 and 101, and decodes the translated addresses supplied from the address translation circuit 5 to enable actual access to each memory cell of the ROMs 100 and 101. For example, when the address output from the address translation circuit 5 is a 10 bit address, the address decoder 7 converts the address into $2^{10}=1024$ signals. Similarly, the address translation circuit 9 disposed in front of the ROMs 102 and 103 decodes $A_2$–$A_n$ to enable actual access to the ROMs 102 and 103.

Figure 3:
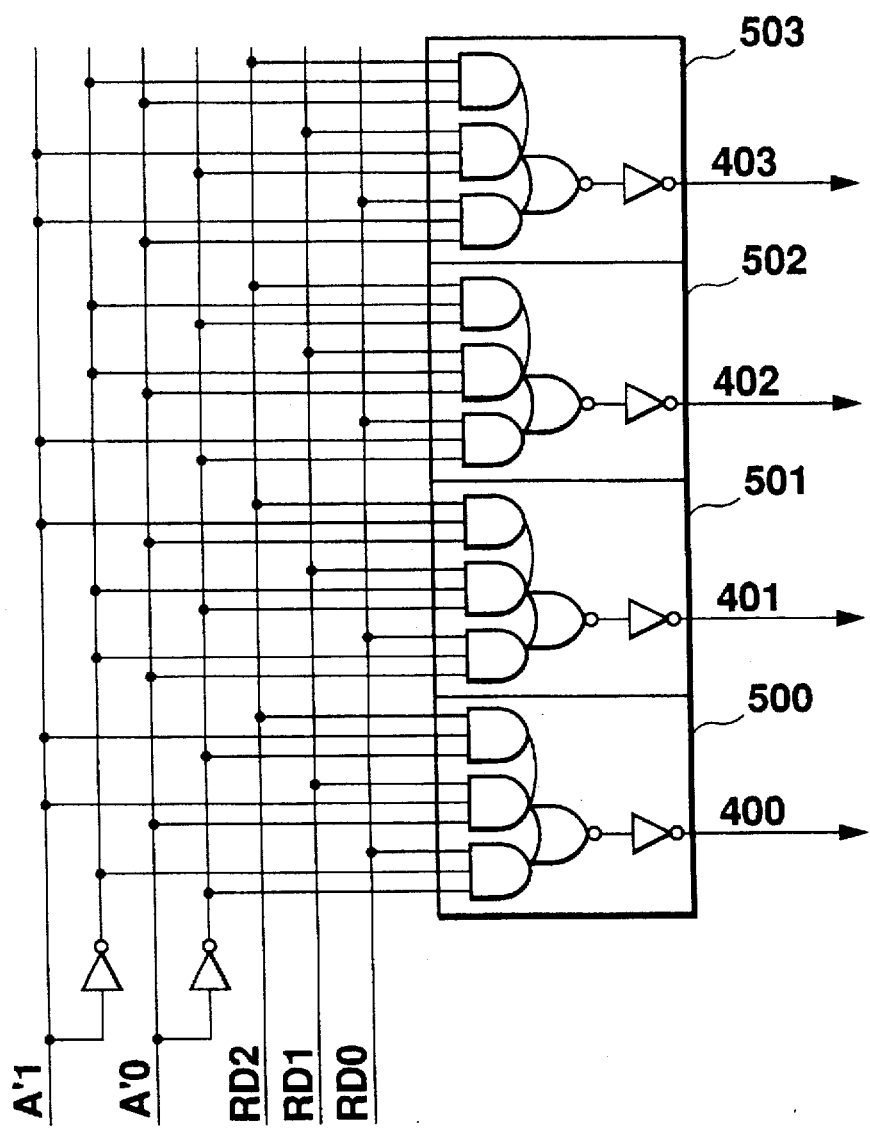
FIG. 3 illustrates an example of a data selector circuit used in the first embodiment.

Output data of the ROMs 100–103 are latched by the latches 200–203, respectively. The latch operation is carried out simultaneously upon the generation of the read signal RD0. Therefore, it occurs only once a cycle, after a predetermined time from the start point of each cycle. Outputs of the data latches 200–203 are connected to the data bus 1 via data buffers 300–303, respectively. Enabling/disabling control of the data buffers 300–303 is carried out by gate signals 400–403 output from the data selector 11. The data selector 11 refers to RD0–RD2, as well as address bits $A'_0$ and $A'_1$ which are obtained by latching address bits $A_0$ and $A_1$ with the latch circuit 12 at the point of RD0 generation. Combination of $A'_0$ and $A'_1$ can define a data buffer to be selected to output the latched data to the bus 1 when the read signal RD0 is generated. For example, in the case that $A'_0=1$ and $A'_1=0$, when RD0 is generated, gate signal 401 is activated to select the data buffer 301, and as a result, data corresponding to the address 4N+1 is output to the data bus 1. Then, when RD1 is generated, gate signal 402 is activated to select the data buffer 302, and data corresponding to the address 4N+2 is output. This operation is embodied by the data selector 11, which is shown in FIG. 3. Gate signals 400–403 are generated by the decoder circuit 500–503 consisting of gate elements, in accordance with the above mentioned rule.

Operation of the memory control circuit will now be described with reference to FIGS. 4 and 5.

Figure 4:
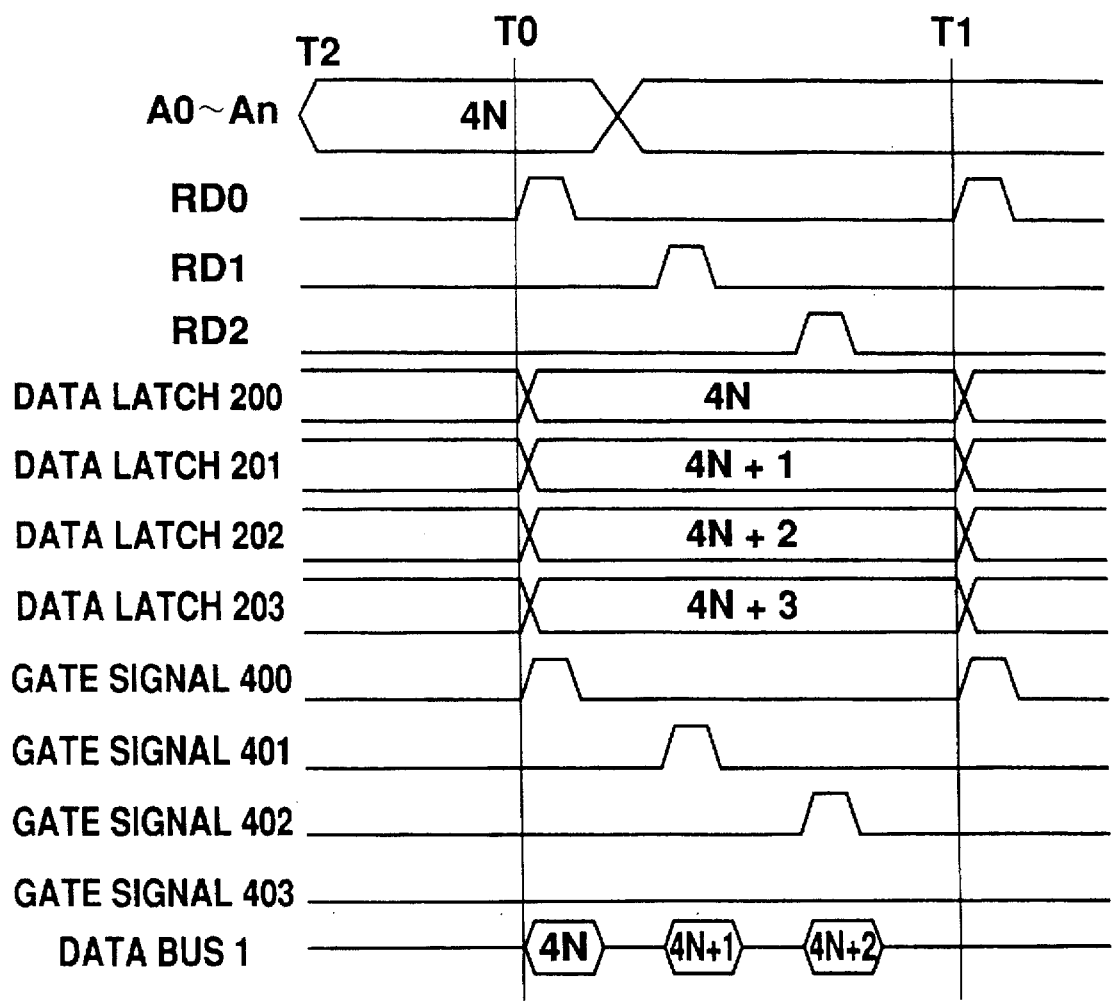
FIG. 4 is a timing chart showing an operation timing of the memory control circuit of the first embodiment, where the read start address is 4N.

FIG. 4 is a timing chart showing the operation of the memory control circuit. In the chart, the cycle starts at time T0 and finishes at T1. Prior to time T0, read start address 4N has already been output at time T2. The address 4N indicates that the ROM from which data is to be read first is ROM 100. Since the requested address is 4N, the address translation circuit 5 supplies that address to the ROMs 100 and 101 without any change. Therefore, address 4N is assigned to all of the ROMs 100–103 which output data corresponding to addresses 4N to 4N+3, respectively.

The ROMs 100–103 will have outputted valid read data by time T0, after the access time from T2. Then, a first byte of read signal RD0 is activated at T0, and the latches 200–203 simultaneously latch data corresponding to the ROMs 100–103, respectively. At the same time, gate signal 400 associated with the data latch 200 is activated, and data from the ROM 100 is output to the data bus 1. After RD0 is deactivated, as RD1 and RD2 are generated in this order, gate signals 401, 402 are activated in sequence, and the corresponding data are output to the data bus 1 from the ROMs 101, 102. As a result of these three data transfer operations, a read of a 3 byte instruction required by the instruction processing unit is completed.

When the start address is 4N+1, the address translation circuit 5 also supplies an address value 4N to the ROMs 100 and 101 with no change. In this case, gate signals 401, 402, 403 are activated one by one in this order, in response to RD0–RD2. As a result, data corresponding to the addresses 4N+1, 4N+2, 4N+3 are output in turn to the data bus 1 in this order.

In summary, when the read start address is 4N or 4N+1, addresses 4N, 4N+1, 4N+2, and 4N+3 are always rendered in a readable state for every read cycle (i.e. every data-latch operation). Among these four bytes, any three bytes of data required by the instruction processing unit are always included, and therefore, this memory read speed by the instruction processing unit is greatly increased. In the embodiment, when the requested three bytes are successive ones, total read time is reduced most efficiently up to one third compared to the conventional way in which an instruction is read every one byte.

Next, another example where the read start address is 4N+2 will be described with reference to FIG. 5.

Figure 5:
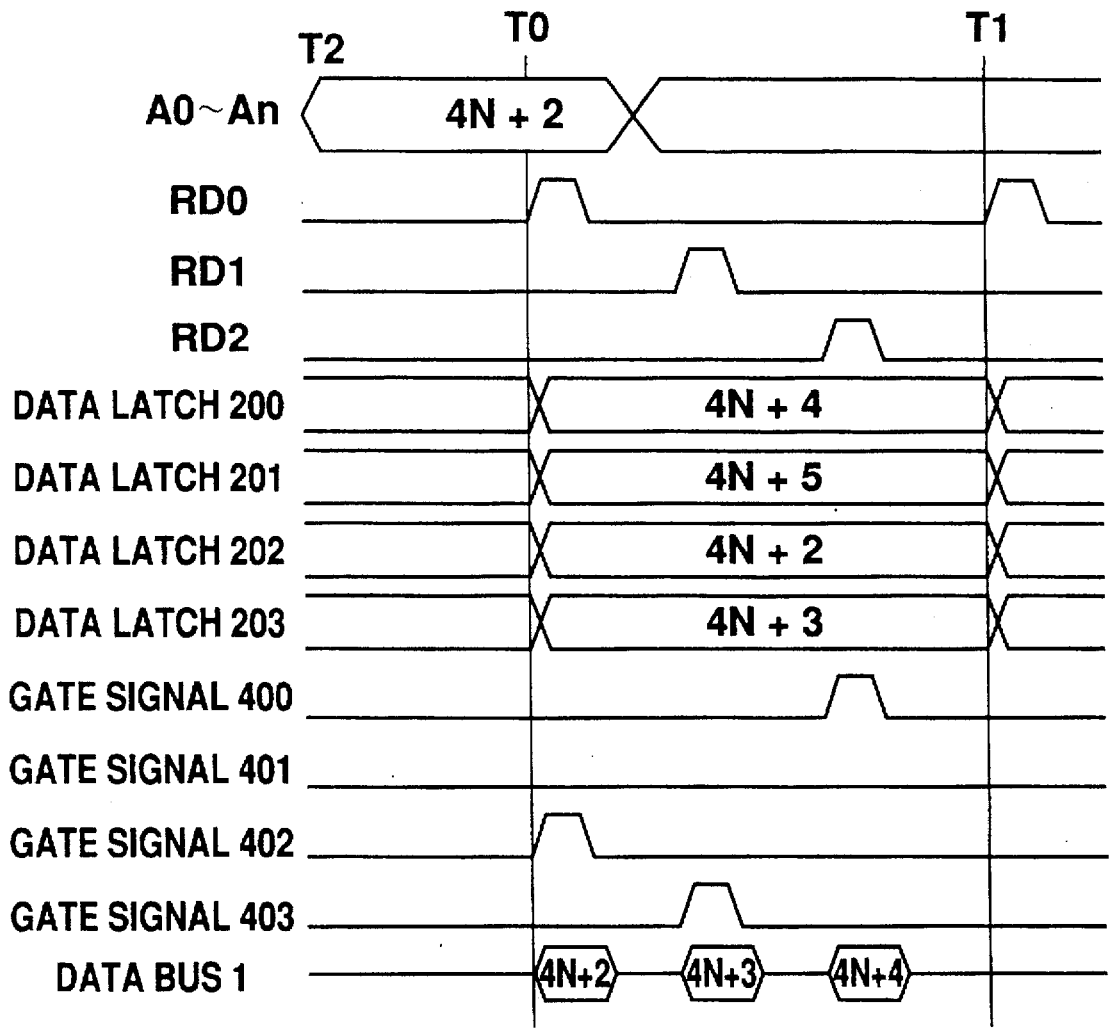
FIG. 5 is a timing chart showing an operation timing of the memory control circuit of the first embodiment, where the read start address is 4N+2.

The read timing of FIG. 5 is the same as FIG. 4, where 3 bytes of read and transfer are allowed in a cycle. However, because the read start address is 4N+2, the address translation circuit 5 assigns address 4(N+1)=4N+4 to the ROMs 100 and 101, while assigning address 4N to the ROMs 102 and 103. As a result, data output from the ROMs 100–103 correspond to the addresses 4N+4, 4N+5, 4N+2, 4N+3, respectively, and the output data are latched by the data latch 200–203. In response to the generation of RD0–RD2, gate signal 402, 403, 400 are activated in this order, and data in correspondence with the addresses 4N+2, 4N+3, and 4N+4 are sequentially read. By these three data transfer operations, 3 bytes of data transfer required by the instruction processing unit is completed. If the first address is 4N+3, data corresponding to the addresses 4N+3, 4N+4, 4N+5 are output to the data bus 1 in this order.

Thus, in the case that the read start address is 4N+2, it becomes possible to read data of addresses 4N+2, 4N+3, and 4N+4 after waiting merely a memory access time. Similarly, when the read start address is 4N+3, a 3 byte read is always possible for every cycle. As a result, a maximum number of bytes of data (i.e. 3 byte of data) can be transferred quickly.

Although the invention has been described with an example of a 3 byte instruction, read operation of 2 bytes or less can be readily understood from FIGS. 4 and 5. If it is a 2 byte instruction, RD2 is not activated in FIGS. 4 and 5. If it is a 1 byte instruction, only RD0 is activated. In these cases, the total time for completing a cycle is naturally shortened. Readout of an instruction of 4 bytes or more is completed by simply repeating the 1–3 byte read cycle several times, and operation of each cycle is the same as those shown in FIGS. 4 and 5.

In either case, it is advantageous that the read speed of the memory control circuit is not influenced even when the address order to be executed is changed by, for example, a branch instruction.

This embodiment has been described under the premise that the memory control circuit is incorporated into a single-chip microcomputer, but it is not limited to only to an integrated circuit device. For example, in an arbitrary apparatus, the memory control circuit can be mounted on a circuit board together with a control element for that apparatus, and used for controlling memory read operations of that control element.

<Second Embodiment>

In this embodiment, the number of blocks of the ROM is generalized so that the memory control circuit can be freely constructed according to an average number of read bytes requested by the instruction processing unit.

Figure 6:
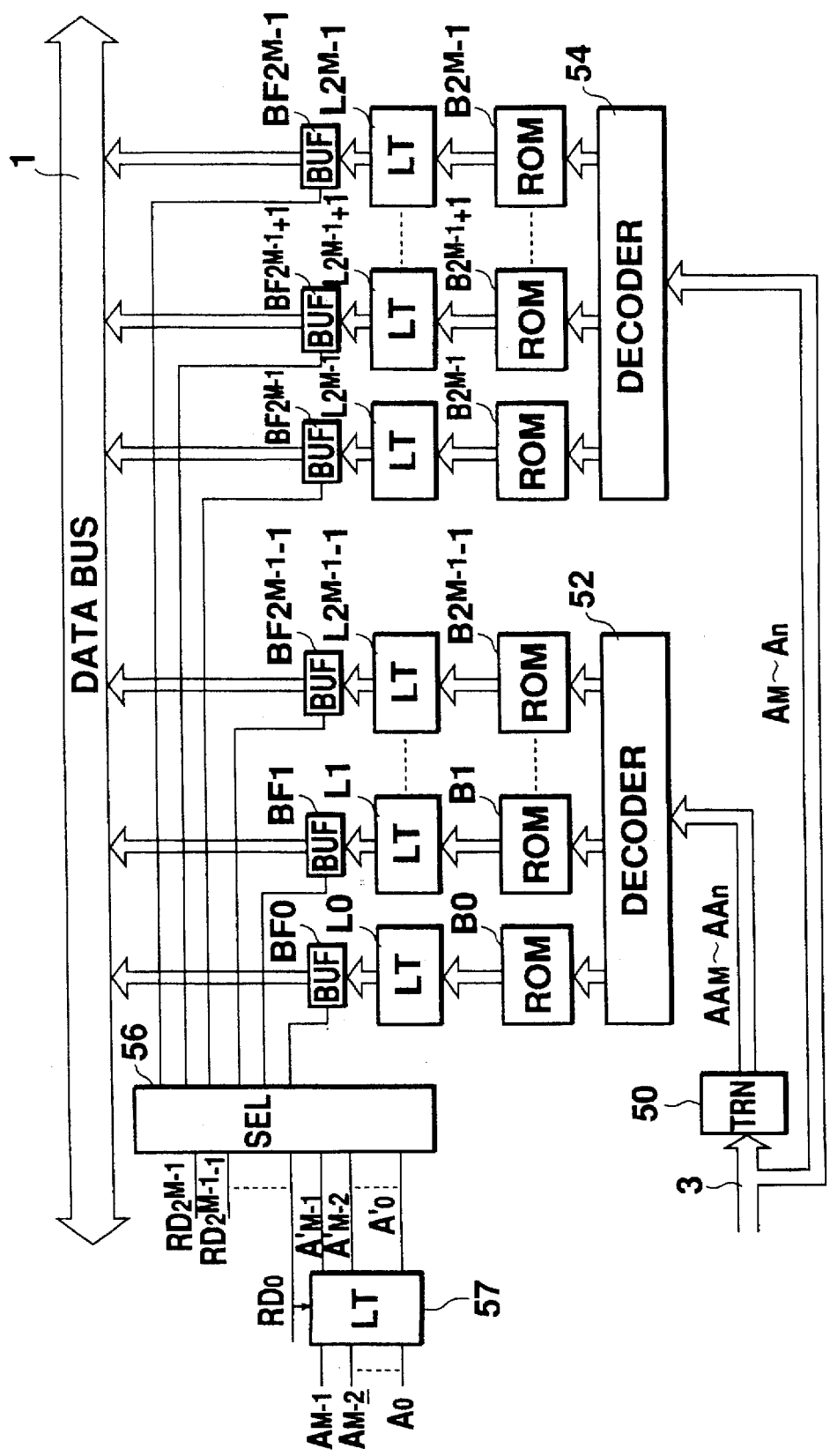
FIG. 6 is a schematic block diagram showing an overall structure of a memory control circuit in accordance with the second embodiment.

FIG. 6 shows an overall structure of the memory control circuit in accordance with this embodiment. The ROM is divided into $2^M$ blocks (i.e. ROM B0–ROM B$2^M$–1), each of which stores data of the corresponding address, as is shown below.

| ROM B0 | address $2^M N$ |
| ROM B1 | address $2^M N + 1$ |
| ROM B$2^M - 1$ | address $2^M N + (2^M - 1)$ |

As has already been mentioned, the ROMs B0–B($2^M$–1) identify their own address as $2^M N$, and do not refer to the address bits $A_0$–$A_{M-1}$ which define offset values.

The address translation circuit 50 provides translation processing to an address supplied through the address bus 3, and feeds the translated address to the former half of the $2^M$ ROMs (i.e. to the ROMs B0 to B($2^{M-1}$–1)). The rule of the address translation is as follows.

(i) When the address is $2^M N$ to $2^M N+(2^{M-1}$–1), no translation is carried out, that is, an address $2^M N$ is supplied to all the ROMs.

(ii) When the address is $2^M N+2^{M-1}$ to $2^M N+2^M$–1, an address value $2^M(N+1)$ corresponding to the next address for the ROM is supplied to the ROMs B0–B($2^{M-1}$–1).

Assuming the address is represented by bits $A_0$–$A_n$, this rule can be summarized as "when address bit $A_{M-1}$ has a value "1", the value represented by bits $A_M$–$A_n$ is incremented for the former half of the ROMs." In FIG. 6, the translated address bits are expressed as AA$_M$–AA$_n$. On the other hand, address bits $A_M$–$A_n$ are supplied to the latter half of the ROMs (i.e. to the ROMs B$2^{M-1}$–B($2^M$–1)) without being subjected to translation processing.

The address decoder 52 decodes (i.e. develops) address bits which have been subjected to translation through the address translation circuit 50, and enables actual access to the memory cells of the ROMs B0 to B$2^{M-1}$–1, while the address decoder 54 decodes address bits $A_M$–$A_n$ and enables access to the ROMs B$2^{M-1}$ to B$2^M$–1.

Outputs of the ROMs B0–B($2^M$–1) are latched by the data latches L0–L($2^M$–1), respectively. The data latch operation is carried out simultaneously with the generation of the first byte read signal RD0. When RD0 is generated, address bits $A_0$–$A_{M-1}$ are latched by the latch circuit 57, and are output as $A'_0$–$A'_{M-1}$. Output of the data latches L0 to L($2^M$–1) are connected to the data bus 1 via data buffers BF0 to BF($2^M$–1), respectively. The enabling/disabling control of the data buffers BF0 to BF($2^M$–1) is carried out by gate signals G0–G($2^M$–1) output from the data selector 56. The data selector 56 refers to RD0–RD$2^{M-1}$ as well as address bits $A'_0$–$A'_{M-1}$, and determines a data buffer from which data is to be output when RD0 is generated.

The operation of the memory control circuit of this embodiment will now be described with reference to FIGS. 7 and 8.

Figure 7:
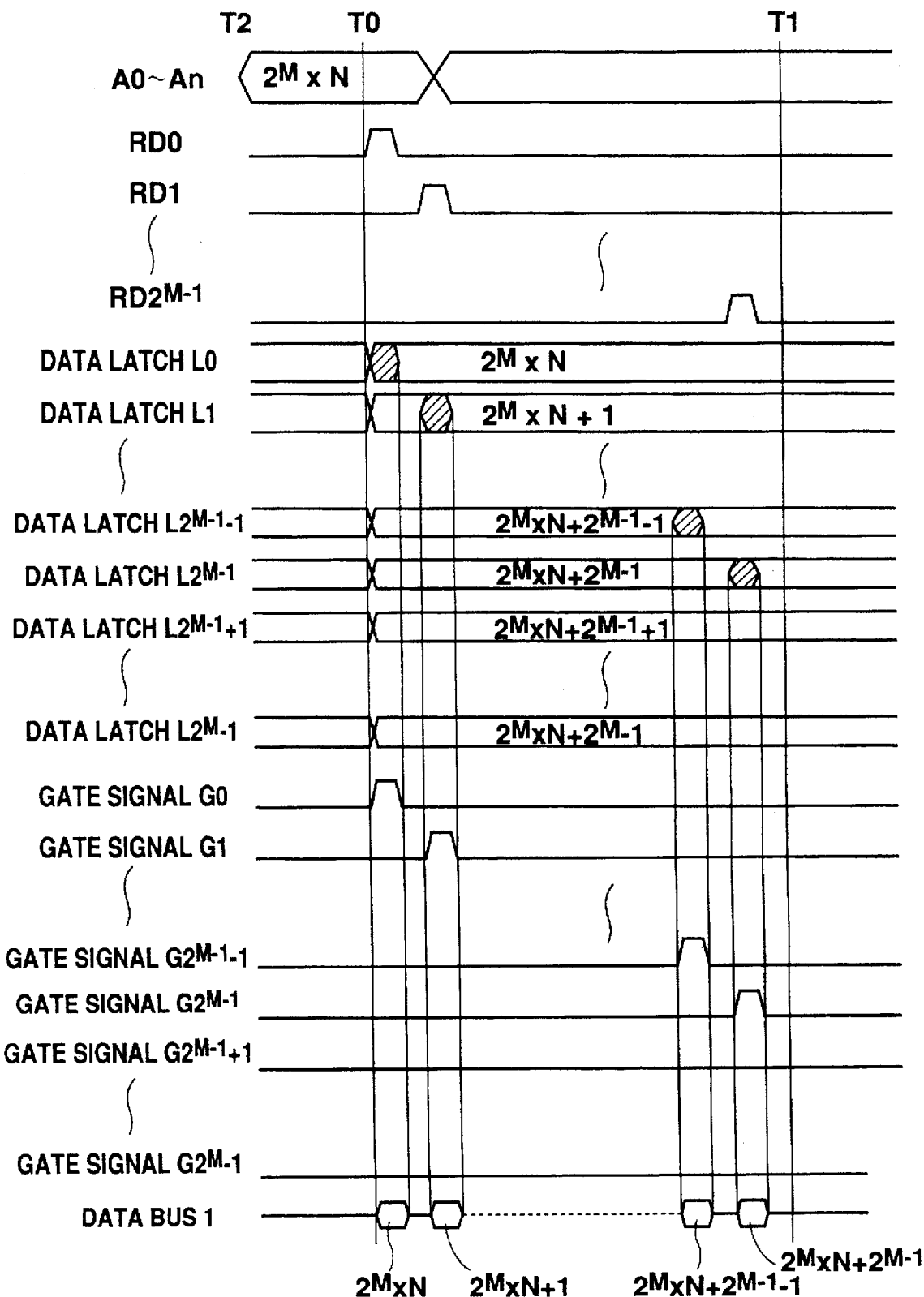
FIG. 7 is a timing chart showing an operation timing of the memory control circuit of the second embodiment, where the read start address is $2^M N$.

In FIG. 7, it is assumed that $2^{M-1}$+1 bytes of instruction are read in a cycle. Accordingly, the read signals from the instruction processing unit are represented as RD0–RD$2^{M-1}$, which corresponds to RD0–RD2 in the first embodiment. In the case where the ROM is divided into $2^M$ blocks, read speed becomes fastest when this byte number of successive reads (i.e. $2^{M-1}$+1 byte read) occur successively. The details of this will be described below.

In the chart, the cycle starts at time T0 and finishes at T1. Prior to time T0, address $2^M N$, which is to be accessed first, has already been output at time T2. The address $2^M N$ indicates that the ROM from which data is first read is ROM B0. Since the address is $2^M N$, the address translation circuit 50 supplies that address data to the ROMs B0–B($2^{M-1}$–1) without any change. Therefore, address $2^M N$ is assigned to all of the ROMs B0–B($2^M$–1), which output data corresponding to addresses $2^M N$–$2^M N+(2^M$–1), respectively.

Similar to the first embodiment, RD0 is activated at T0, and the data latches L0–L($2^M$–1) simultaneously latch data from the ROMs B0–B($2^M$–1), respectively. At the same time, gate signal G0 associated with the ROM B0 is activated, and data from the ROM B0 is output to the data bus 1. Then, RD1, RD2, ..., RD$2^{M-1}$ are activated in turn, and read of the ($2^{M-1}$+1) byte instruction required by the instruction processing unit is completed by ($2^{M-1}$+1) data transfer operations.

When the first address is in the range of $2^M N$ to $2^M N+(2^{M-1}$–1), the address translation circuit 50 also supplies that address to the ROMs B0–B($2^{M-1}$–1), as it is. Therefore, according to the read start address, read start block and read finish block in FIG. 7 are shifted downwardly.

Thus, when the read start address is any one of $2^M N$ to $2^M N+(2^{M-1}$–1), a $2^{M-1}$+1 byte read always becomes possible after a memory access (i.e. at every latching operation), and a maximum number of bytes of data transfer as required by the instruction processing unit is quickly carried out. In this embodiment, when $2^{M-1}$+1 bytes of instruction data occurs successively, the read speed is increased up to a maximum of $2^{M-1}$+1 times as compared with the conventional way.

Next, a case where the read start address corresponds to the latter half blocks (i.e. address $2^M N+2^{M-1}$) will be described with reference to FIG. 8. It is also assumed that $2^{M-1}$+1 bytes of instruction data is read.

Since the first address to be read is $2^M N+2^{M-1}$, the address translation circuit 5 supplies address $2^M(N+1)$ to the former half ROMs B0 to B$2^{M-1}$–1. Namely, among $2^M$ ROMs (ROMs B0–B$2^M$–1), the leading block of the latter half (i.e. ROM B$2^{M-1}$) outputs data corresponding to the smallest address. The address value is incremented from this block via the last block of the latter half, returning to the first block of the former half and to the last block of the former half. Consequently, the last block of the former half (i.e. ROM B$2^{M-1}$–1) outputs data corresponding to the largest address. In other words, the address value is cycled from the latter half blocks to the former half blocks. This rule is expressed as follows.

| | ROM B0 | Address $2^MN + 2^M$ |
|---|---|---|
| Former Half Blocks | ROM B1 | Address $2^MN + (2^M + 1)$ |
| | ROM B($2^{M-1} - 1$) | Address $2^MN + (2^M + 2^{M-1} - 1)$ |
| | ROM B$2^{M-1}$ | Address $2^MN + 2^{M-1}$ |
| Latter Half Blocks | ROM B($2^{M-1} + 1$) | Address $2^MN + 2^{M-1} + 1$ |
| | ROM B($2^M - 1$) | Address $2^MN + (2^M - 1)$ |

In response to RD0–RD$2^{M-1}$, gate signals G$2^{M-1}$–G$2^M$–1 and G0 are successively activated in this order, and therefore, addresses $2^MN+2^{M-1}$, $2^MN+2^{M-1}+1, \ldots, 2^MN+2^M-1, 2^MN+2^M$ are correctly read in this order. As a result of carrying out each data output $2^{M-1}+1$ times, transfer of the $2^{M-1}+1$ byte instruction is completed. Generally speaking, when the first address is in the range of $2^MN+2^{M-1}$ to $2^MN+2^M-1$, data is first read from the latter half of the blocks and then read from the former half of the blocks for the rest of the bytes. As a result, a $2^{M-1}+1$ byte instruction can be transferred in a cycle.

Figure 8:
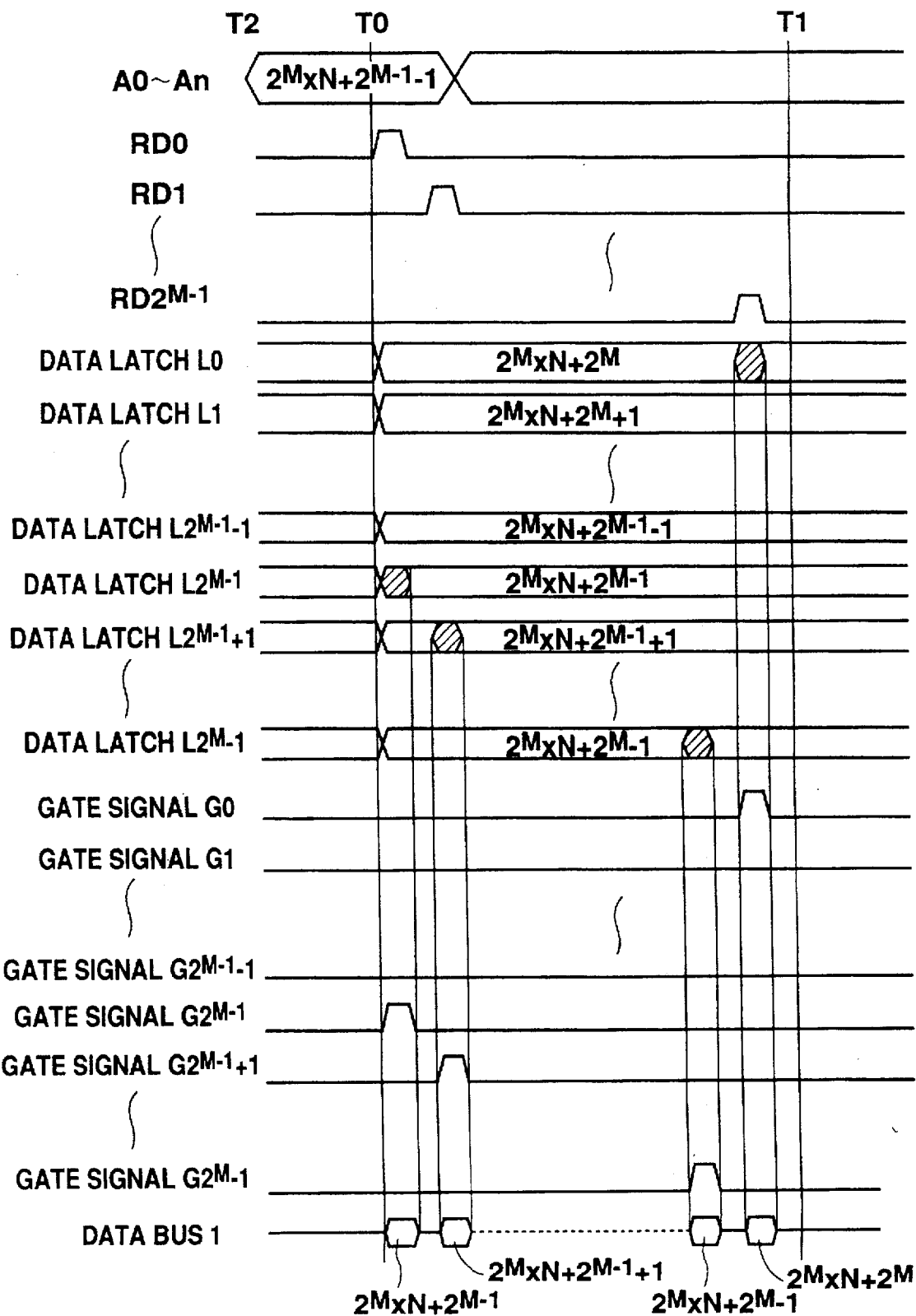
FIG. 8 is a timing chart showing an operation timing of the memory control circuit of the second embodiment, where the read start address is $2^M N+2^{M-1}$.

Although this embodiment has been described with an example of a $2^{M-1}+1$ byte instruction, other byte sizes for the read operation can be readily understood from FIGS. 7 and 8. The action of such cases is the same as the examples described in connection with the first embodiment.

This embodiment is not limited to only an integrated circuit device (single-chip microcomputer).

<Third Embodiment>

In this embodiment, the instruction processing unit defines read bytes using only two signals, RDLAT and RDINC, although three signals RD0–RD2 were used for defining read bytes in the first embodiment.

RDLAT functions in the same manner as RD0 of the first embodiment, while RDINC serves as signals RD1 and RD2. In the first embodiment, RD1 and RD2 designate bytes for second and third transfer operations, respectively. Since RD1 and RD2 are always generated in this order, they can be distinguished by a peripheral circuit. More particularly, after the generation of RDLAT, RDINC is generated twice, the first RDINC corresponding to RD1, and the second RDINC corresponding to RD2. This can be controlled by the peripheral circuit by counting the generation of RDINC.

Figure 9:
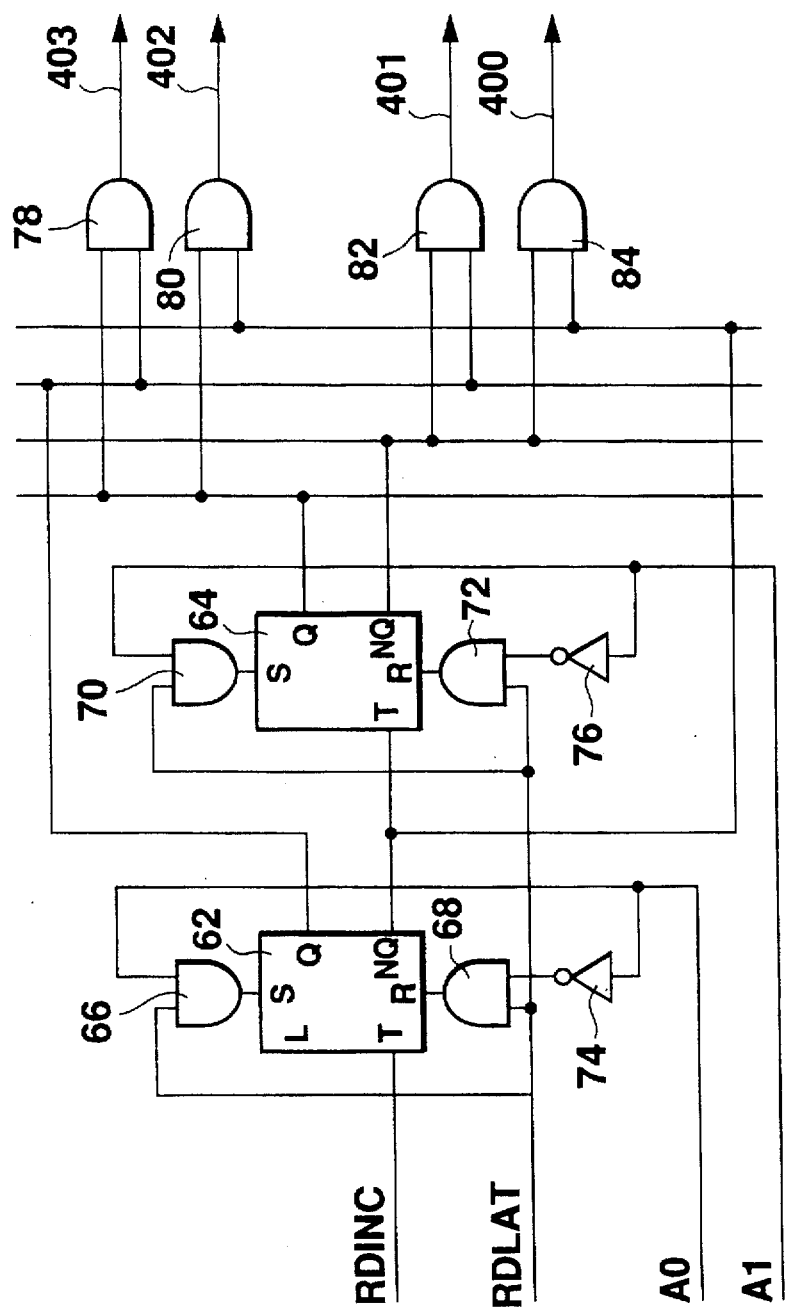
FIG. 9 shows an example of a data selector circuit used in the third embodiment.

FIG. 9 shows an example of the data selector circuit of the memory control circuit of this embodiment, which comprises two T flip-flops 62, 64, gate elements 66, 68, 70, 72, 74, 76, and gate elements 78, 80, 82, 84 for generating final signals based on the output from the T flip-flops. The final signals generated from the selector circuit are gate signals 400–403, each of which corresponds to the ROMs 100–103, respectively.

For example, assuming that $A_0=0$ and $A_1=0$, when RDLAT is generated, inverted output NQ of the T flip-flops 62 and 64 are both "1", and the gate signal 400 is activated. Then, when RDINC is generated, the positive output Q becomes "1", and the gate signal 401 is activated. Thus, the gate signals 400–403 are successively activated by combination of the values of $A_0$ and $A_1$, thereby achieving correct read with only two read signals output from the instruction processing unit.

This structure can also be applied to the generalized memory control circuit described in the second embodiment. In such a case, the number of read signals from the instruction processing unit is two, i.e., RDLAT and RDINC, and the number of the T flip-flops becomes M.

As has been described, according to the memory control circuit of the invention, the memory read speed of the instruction processing unit is greatly improved. Even when the sequence of addresses to be executed is changed by, for example, a branch instruction, the read speed of the memory control circuit is not influenced. Data read from $2^{M-1}+1$ successive addresses is always generated in a cycle no matter what address is designated as the read start address. As a result, an improved memory control circuit having a simplified structure and a constant high-speed read operation is realized, overcoming defects of the conventional interleave or cache memory structure, where read speed depends on the read start address and a circuit is constructed in a more complicated manner. According to the present invention, the address translation circuit merely gives translation processing to address output from the instruction processing unit in accordance with a predetermined rule to successively read given bytes of data in a cycle, which is fundamentally different from an interleave system which is optimally designed on the premise that the address is always increased in a regular order. The present invention also has advantages in size and price compared with a cache memory system requiring a special memory. Further, there is no necessity to arrange instructions in the memory at constant intervals, and therefore, it does not reduce the utilization efficiency of the memory.

In view of the above mentioned advantages, the memory control circuit of the invention is especially effective when it is incorporated in an integrated circuit device such as a single-chip microcomputer, not only because it has quite a simple circuit structure, but also because it is easy to manufacture the semiconductor device since it does not need the most accurate semiconductor process. Furthermore, the memory control circuit is directly connected to the instruction processing unit on the integrated circuit device, and is optimized to the memory read rule of the instruction processing unit, with the flexibility of defining a circuit size and read speed according to the product specification. Having these advantages, the memory control circuit of present invention satisfies the condition of low expense and miniaturization required for an integrated circuit device mounted in an electronic apparatus for personal use, realizing a superior price-to-performance ratio.

What is claimed is:

1. A memory control circuit for controlling read and transfer of data from a memory in response to a read request by an instruction processing unit, comprising:

a memory divided into $2^M$ blocks i (i=0, 1, ..., $2^M-1$), each block i storing data corresponding to address $2^MN+i$, where M is a natural number equal to or greater than 2, and N is a non-negative integer;

an address translation circuit for selectively performing address translation on a read address issued by the instruction processing unit in accordance with a predetermined translation rule, the address translation circuit receiving the read address and supplying output to blocks j (j=0, 1, ..., $2^{M-1}-1$) so that the read address is provided via the address translation circuit to the blocks j while the read address is directly provided to blocks k (k=$2^{M-1}$, $2^{M-1}+1$, ..., $2^M-1$);

a latch circuit provided for each block with one-to-one correspondence, each latch circuit latching data read from the corresponding block, the latching operation being carried out simultaneously for all of the blocks so as to allow $2^M$ blocks of memory including at least $2^{M-1}+1$ successive addresses to be readable by the instruction processing unit for every latching action; and a selector circuit for selecting data among the latched data and outputting the selected data to a data bus, in response to an address and transfer timing output by the instruction processing unit, wherein when the read start address requested by the instruction processing unit is $2^M N+j$, the address translation circuit is not activated so that address $2^M N$ is supplied to all blocks, and when the read start address requested by the instruction processing unit is $2^M N+k$, the address translation circuit is activated to perform address translation so that address $2^M(N+1)$ is supplied to the blocks j, while address $2^M N$ is supplied to the blocks k.

2. The memory control circuit according to claim 1, wherein the instruction processing unit requests data-read of a maximum of $2^{M-1}+1$ successive addresses at one time.

3. The memory control circuit according to claim 2, wherein the instruction processing unit carries out a plurality of data transfers in a single cycle, the data being included in a single read operation.

4. The memory control circuit according to claim 3, wherein the instruction processing unit generates an address every one cycle unit, the generated address becoming a start address of data to be read in the next cycle.

5. The memory control circuit according to claim 3, wherein the simultaneous latching action of each latch circuit occurs only once a cycle after a predetermined time from the beginning of the cycle.

6. The memory control circuit according to claim 3, wherein the instruction processing unit generates $2^{M-1}+1$ read signals which correspond to data of the $2^{M-1}+1$ successive addresses.

7. The memory control circuit according to claim 6, wherein one of the read signals serves as a latch timing signal for the latch circuits.

8. The memory control circuit according to claim 3, wherein the instruction processing unit generates two read signals, one of the signals demanding first data read for each cycle, and the other of the signals demanding the subsequent data read.

9. The memory control circuit according to claim 8, wherein said one signal serves as a latch timing signal for the latch circuits.

10. The memory control circuit according to claim 1, wherein the read address is represented by address bits $A_0$–$A_n$, and the address translation circuit is an adder for incrementing an address value represented by address bits $A_M$–$A_n$ when the address bit $A_{M-1}$ has a value of "1".

11. An integrated circuit device incorporating the memory control circuit described in claim 1.

12. The integrated circuit device according to claim 11, wherein the integrated circuit device is a single-chip microcomputer.

13. A memory control circuit for controlling read and transfer of data from a memory in response to a read request by an instruction processing unit, the memory being divided into an even number of blocks greater than or equal to 4, said memory control circuit comprising:

an address translation circuit for selectively performing address translation on a read address issued by the instruction processing unit in accordance with a predetermined translation rule, the address translation circuit supplying output to the blocks of one half of the memory so that the read address is provided via the address translation circuit to the blocks of the one half of the memory, while the read address is directly provided to the blocks of the other half of the memory;

a plurality of latch circuits, each of the latch circuits being provided for one of the blocks of the memory to latch data read from the corresponding block, the latching operation being carried out simultaneously for all of the latch circuits so as to allow all blocks of the memory, including at least N successive addresses (where N=half the number of blocks+1), to be made readable by the instruction processing unit for every latching operation; and a selector circuit for selecting data from the latched data for output to a data bus, the selector circuit operating in response to a timing signal from the instruction processing unit, wherein when the read start address requested by the instruction processing unit corresponds to an address in one of the blocks of the one half of the memory, the address translation circuit is not activated so that the read address issued by the instruction processing unit is supplied to all blocks, and when the read start address requested by the instruction processing unit corresponds to an address in one of the blocks of the other half of the memory, the address translation circuit is activated to perform address translation so that a translated read address is supplied to the blocks of the one half of the memory, while the read address issued by the instruction processing unit is supplied to the blocks of the other half of the memory.

14. The memory control circuit according to claim 13, wherein the instruction processing unit requests data-read of a maximum of N successive addresses at one time.

15. The memory control circuit according to claim 14, wherein the instruction processing unit carries out a plurality of data transfers in a single cycle, the data being included in a single read operation.

16. The memory control circuit according to claim 15, wherein the instruction processing unit generates an address every one cycle unit, the generated address becoming a start address of data to be read in the next cycle.

17. The memory control circuit according to claim 15, wherein the simultaneous latching action of the latch circuits occurs only once a cycle after a predetermined time from the beginning of the cycle.

18. The memory control circuit according to claim 13, wherein the read address is represented by address bits $A_0$–$A_n$, and the address translation circuit selectively increments the value of address bits $A_M$–$A_n$ based on the value of address bits $A_0$–$A_{M-1}$.

* * * * *